(12) United States Patent
Nigatu (10) Patent No.: US 11,392,810 B2
(45) Date of Patent: Jul. 19, 2022

(54) COVERT FLOATING IMAGE

(71) Applicant: GEMALTO INC, Austin, TX (US)

(72) Inventor: Tadesse G. Nigatu, Cottage Grove, MN (US)

(73) Assignee: THALES DIS FRANCE SA, Meudon (FR)

( * ) Notice: Subject to any disclaimer, the term of this patent is extended or adjusted under 35 U.S.C. 154(b) by 14 days.

(21) Appl. No.: 16/712,157

(22) Filed: Dec. 12, 2019

(65) Prior Publication Data

US 2021/0182638 A1    Jun. 17, 2021

(51) Int. Cl.
G06K 19/06      (2006.01)
G03F 7/20       (2006.01)

(52) U.S. Cl.
CPC ..... *G06K 19/06028* (2013.01); *G03F 7/7015* (2013.01)

(58) Field of Classification Search
CPC .......... G06K 19/06028; G03F 7/7015
See application file for complete search history.

(56) References Cited

U.S. PATENT DOCUMENTS

| 2004/0190102 A1* | 9/2004 | Mullen | B29C 35/10 264/494 |
| 2008/0050660 A1* | 2/2008 | Staub | B42D 25/42 430/5 |
| 2012/0038988 A1* | 2/2012 | Staub | B42D 25/324 359/576 |
| 2019/0152251 A1* | 5/2019 | Schilling | B42D 25/373 |

* cited by examiner

*Primary Examiner* — Thien M Le
*Assistant Examiner* — Asifa Habib
(74) *Attorney, Agent, or Firm* — The Jansson Firm; Pehr B. Jansson (57) ABSTRACT

A method of producing at least one security element (9) in a data carrier (1) comprises the steps of: Providing a source of radiation (6) that is configured to emit electromagnetic radiation (R), providing a data carrier (1) that comprises at least one guiding layer (2) and at least one processing layer (3), providing at least one masking layer (4) comprising at least one masking element (5), and irradiating electromagnetic radiation (R) from the source of radiation (6) through the masking layer (4) and onto the data carrier (1). Electromagnetic radiation (R) that impinges on a region (7a) of the masking layer (4) having no masking element (5) impinges on the at least one processing layer (3) as electromagnetic radiation having a first radiation property (Ra), whereby the at least one processing layer (3) is cured in said region of impingement (8a) into a first curing state. Electromagnetic radiation (R) that impinges on a region (7b) of the masking layer (4) comprising the at least one masking element (5) impinges on the at least one processing layer (3) as electromagnetic radiation having a second radiation (Rb) property being different from the first radiation property (Ra), whereby the at least one processing layer (3) is cured in said region of impingement (8b) into a second curing state. The second curing state of the processing layer (3) constitutes the security element (9).

26 Claims, 3 Drawing Sheets

COVERT FLOATING IMAGE

TECHNICAL FIELD

The present invention relates to a method of producing at least one security element in a data carrier according to claim 1 and to a data carrier comprising at least one security element according to claim 15, respectively.

PRIOR ART

Various solutions for providing authentication of currency and documents and identification as well as distinction of authentic products from counterfeit products exist. In this context, the generation of data carriers that can be incorporated into an article to be protected and that comprise one or more security elements being produced by electromagnetic radiation that is guided into the data carrier with the help of a microstructure has become a common practice in recent years. In particular, security elements being so-called floating images can be created by passing high-energy radiation, in particular laser radiation, through micron-sized transparent lenses that focus the laser radiation such that the thus focused laser light generates burned marks in the data carrier. In the context of the present invention, a floating image is understood as an image that appears in three dimensions, i.e. an image that gives an impression of depth.

Data carriers comprising a security element in the form of a floating image offer a high level of counterfeit security. However, their production is a laborious and expensive process. Namely, in addition to the high demands associated with the usage of laser radiation such as high safety requirements and specific expertise also the equipment is expensive.

SUMMARY OF THE INVENTION

It is an object of the present invention to provide a method of producing at least one security element in a data carrier which is simplified but at the same time offers a high level of counterfeit security.

This object is achieved by means of a method according to claim 1. In particular, a method of producing at least one security element in a data carrier is provided, the method comprising the steps of i) providing a source of radiation that is configured to emit electromagnetic radiation, ii) providing a data carrier that comprises at least one guiding layer and at least one processing layer, iii) providing at least one masking layer comprising at least one masking element, and iv) irradiating electromagnetic radiation from the source of radiation through the masking layer and onto the data carrier. The at least one processing layer is arranged after the at least one guiding layer with respect to an extension direction and the at least one masking layer is arranged before the at least one guiding layer with respect to the extension direction. That is, the at least one masking layer is arranged after the source of radiation, the at least one guiding layer is arranged after the masking layer, and the at least one processing layer is in turn arranged after the at least one guiding layer. Again in other words, the at least one guiding layer is arranged between the at least one masking layer and the at least one processing layer. The at least one guiding layer is configured to guide impinging electromagnetic radiation into the at least one processing layer and the at least one processing layer is curable upon an interaction with electromagnetic radiation. Electromagnetic radiation that impinges on a region of the masking layer having no masking element impinges on the at least one processing layer as electromagnetic radiation having a first radiation property, whereby the at least one processing layer is cured in said region of impingement into a first curing state. However, electromagnetic radiation that impinges on a region of the masking layer comprising the at least one masking element impinges on the at least one processing layer as electromagnetic radiation having a second radiation property being different from the first radiation property, whereby the at least one processing layer is cured in said region of impingement into a second curing state. The second curing state of the processing layer constitutes the security element.

That is to say, the curable processing layer is cured into different curing states due to an impingement of electromagnetic radiation having different radiation properties. The different radiation properties are caused by the masking layer, in particular by the presence and absence of a masking element on the masking layer. In doing so, the shape of the masking element is reproduced in the processing layer, whereby a security feature having the shape of the masking element is generated in the processing layer.

The number of different curing states depends on the number of masking elements of the masking layer. For example, if the masking layer comprises a single masking element, then electromagnetic radiation of two different properties will leave the masking layer towards the processing layer: namely, on the one hand side, electromagnetic radiation having a first radiation property in regions of the masking element and, on the other hand side, electromagnetic radiation having a second radiation property in regions without the masking element. However, if the masking layer comprises two or more masking elements that differ from one another, then said two or more masking elements will result in electromagnetic radiation having two or more radiation properties which also differ from one another. Consequently, two or more security elements can be created. It should therefore be understood that any explanations provided herein with respect to one security element being caused by the presence of one masking element likewise applies to the situation where two or more masking elements are present in order to produce two or more security elements. Hence, the processing layer is cured into two or more different curing states, whereby a security element is produced. Due to the presence of the at least one guiding layer that is configured to guide impinging electromagnetic radiation into the processing layer the security element corresponds to a so-called floating element. To this end, the guiding layer guides impinging electromagnetic radiation that is emitted from the source of radiation into the curable processing layer. Hence, a guiding is achieved during the manufacturing process. However, and as will be explained in greater detail below, since the guiding layer preferably remains present in the data carrier, a guiding of electromagnetic radiation being emitted from a lighting source such as a flashlight is also guided towards the processing layer, whereby the floating security element is made visible to an observer. In summary, it can thus be said that the guiding layer participates in the creation of the security element as well as in making the floating security element visible to an observer.

In any case, the at least one guiding layer is preferably configured such that impinging electromagnetic radiation, being it from the source of radiation or from a lighting source, is guided into the at least one processing layer.

The source of radiation preferably corresponds to a source that is configured to emit electromagnetic radiation in the ultraviolet region of the electromagnetic spectrum and/or in the visible region of the electromagnetic spectrum and/or in the infrared region of the electromagnetic spectrum. Preferably, and as will also be explained in more detail further below, the electromagnetic radiation that is used to cure the processing layer corresponds to ultraviolet light that is emitted from a UV emitter such as a black light lamp or the like. However, and depending on the chemical properties of the curable processing layer, other radiation sources and consequently radiation wavelengths could be used as well. Hence, unlike in the prior art where floating images are generated by means of a laser or other sophisticated radiation generating systems the present invention uses a simple source of radiation such as a black light lamp. In this way a floating security element is generated which offers a high level of counterfeit security but is at the same time produced in a simple way.

The masking layer can be arranged at a distance from the at least one guiding layer with respect to the extension direction. That is to say, the masking layer preferably corresponds to a component that is configured separately from the data carrier and which is spaced apart from the data carrier. In other words, it is preferred that there is no physical contact established between the masking layer and the data carrier.

The guiding layer and the processing layer can be arranged immediately adjacent to one another with respect to the extension direction. Alternatively, the guiding layer and the processing layer can be arranged at a distance from one another with respect to the extension direction. In the former case, the expression "immediately adjacent" means that the guiding layer is directly applied onto the processing layer without any other element being arranged there between or with another element such as an adhesive being arranged there between. However, said other element merely serves the purpose of connecting the guiding layer with the processing layer. In the latter case, however, it is conceivable that one or more layers are arranged between the guiding layer and the processing layer, see explanations provided further below.

The guiding layer and the processing layer are preferably permanently fixed within the data carrier. Permanently fixed means that the guiding layer is not removed from the processing layer during the method of production or after production. This is in contrast to the masking layer, for example, which is preferably only present during the method of production but which is afterwards put aside.

A distance between the source of radiation and the masking layer can be varied with respect to the extension direction. In addition or alternatively a distance between the masking layer and the guiding layer can be varied with respect to the extension direction. By changing a distance between the source of radiation and the masking layer, and therefore also the at least one masking element, and/or by changing a distance between the masking layer, and therefore also the at least one masking element, and the guiding layer it is possible to adjust a depth and a width of the virtual security element movement. To this end it is preferred to generate a particular security element with a distance between the masking layer and the guiding layer being constant and to change said distance to another distance that is then kept constant during the generation of another security element, if desired.

The guiding layer preferably comprises at least one guiding structure, wherein the at least one guiding structure is configured to focus impinging electromagnetic radiation at a specific focal length with respect to the extension direction, the at least one guiding structure preferably corresponding to a lens structure such as a spherical and/or semi-spherical lens array. The lens array can be understood as a plurality of lenses that are arranged in a specific pattern. The lenses and their specific arrangement are preferably designed so that when the finished data carrier is viewed by an observer from different viewing angles, the security element is seen differently. Namely, the security element seen through the lens array is given an illusion of depth and appears to change or move as the data carrier is viewed from different viewing angles. Depending on the focal length of the guiding structure the height of the security element within the processing layer can be adjusted. In this regard, it should be noted that a size of the security element, i.e. a spatial extent of the security element, can be determined and thus adjusted by the focal length of the lens structure, however to a less extent as compared to a size adjustment that results from an adjustment of the distance between the masking layer and the lens structure, see above.

The at least one guiding structure, preferably the entire guiding layer including the guiding structure, can be generated by casting and curing. For example, a liquid material constituting the guiding structure or the entire guiding layer can be poured into a mould that comprises a hollow cavity of the desired shape of the guiding structure or the entire guiding layer, respectively. Said liquid material is then allowed to solidify. Depending on the materials used, the solidification can be carried out or is assisted by irradiating electromagnetic radiation, for example UV light in the case of UV-curing materials.

The masking layer preferably comprises at least one transparent and/or thermoplastic polymer, particularly preferably at least one of polycarbonate, polyethylene, polybutylene.

The at least one masking element preferably is essentially opaque and preferably corresponds to a metal compound, a print and/or an embossment in and/or on the masking layer.

That is to say, a masking layer comprising at least one masking element is preferred, which masking layer comprises transparent and opaque regions. Essentially opaque means that impinging electromagnetic radiation is at least partially attenuated.

For example, in the case of a masking element corresponding to a metal compound it is conceivable to provide said metal compound with small holes or slits that allow passing of light. A variety of metal compounds are conceivable as masking elements. In principle, any solid metal compound which exhibits at least a partial opacity could be used. Likewise, a masking element in the form of a print or an embossment is preferably configured so as to allow a certain passage of light. In the case of a masking element in the form of an embossment the original, i.e. the unembossed masking layer is preferably provided by a transparent material. After embossment the embossment corresponds to a structure in the masking layer that alters the path of electromagnetic radiation passing through the embossment as compared to the path of electromagnetic radiation that passes through regions of the masking layer where no embossment is present. It is this difference in the property of the electromagnetic radiation that manifests itself in the processing layer.

Particularly preferably the masking layer and the at least one masking element are configured such, that the intensity of electromagnetic radiation passing through the at least one masking element is lower than the intensity of electromagnetic radiation passing through regions of the masking layer where there is no masking element present.

The first radiation property and the second radiation property in each case preferably correspond to an intensity of the electromagnetic radiation. Hence, if electromagnetic radiation being emitted from the source of radiation impinges on the masking layer in a region of the masking layer having no masking element said electromagnetic radiation will pass through the masking layer as electromagnetic radiation having a first intensity that is higher than a second intensity associated with electromagnetic radiation that passes through the masking layer in a region of the masking element. Consequently, the data carrier which is arranged after the masking layer with respect to the extension direction will be irradiated with electromagnetic radiation of different intensity.

The guiding layer preferably comprises at least one polymer, preferably at least one transparent polymer and/or thermoplastic polymer. The guiding layer particularly preferably comprises at least one of acrylic resin, acrylic polymer, polycarbonate, polyethylene terephthalate, polypropylene, and polyethylene. Additionally or in the alternative the at least one processing layer preferably comprises at least one of a polymer such as polyester, acrylic elastomer, urethane, acrylate, methacrylate, a UV-curing resin, and a cationic curing resin. The processing layer more preferably comprises at least one of an epoxy resin acrylate resin such as epoxy acrylate, urethane acrylate, a methacrylate resin such as epoxy methacrylate, and urethane methacrylate. The processing layer particularly preferably comprises at least one of ethoxylated nonylphenol acrylate, ethoxylated Bisphenol A diacrylate, hydroxyethyl acrylate, and acrylic elastomer.

That is, it is conceivable that the guiding layer and/or the processing layer consist of one of the above components. However, it is likewise conceivable that the guiding layer and/or the processing layer correspond to a mixture of two or more of the above components. A preferred guiding layer consists of cast and cured acrylic semi-spherical stricter.

For example, a first preferred formulation for a processing layer can comprise ethoxylated nonylphenol acrylate (for example Sartomer SR 404), ethoxalated Bisphenol A diacrylate (for example Sartomer SR 348), and a photo initiator. Preferably, said components are present in the following amounts:
  ethoxylated nonylphenol acrylate: between 40 to 80 percent by weight, preferably about 60 percent by weight;
  ethoxylated Bisphenol A diacrylate: between 15 to 45 percent by weight, preferably about 30 percent by weight;
  photo initiator: between 0.5 and 5 percent by weight, preferably about 2 percent by weight.

A second preferred formulation for a processing layer can comprise ethoxylated nonylphenol acrylate (for example Sartomer SR 404), ethoxylated Bisphenol A diacrylate (for example Sartomer SR 348), a photo initiator, hydroxyethyl acrylate (HEA), and acrylic elastomer (KURARAY) (for example LA2330).

Preferably, said components are present in the following amounts:
  ethoxylated nonylphenol acrylate: between 30 to 50 percent by weight, preferably about 45 percent by weight;
  ethoxylated Bisphenol A diacrylate: between 10 to 20 percent by weight, preferably about 15 percent by weight;
  photo initiator: between 0.5 and 5 percent by weight, preferably about 1 percent by weight;
  hydroxyethyl acrylate: between 30 and 50 percent by weight, preferably about 40 percent by weight;
  acrylic elastomer: between 10 to 20 percent by weight, preferably about 15 percent by weight.

A third preferred processing layer comprises a mixture of formulations 1 and 2 as indicated above and in a mixing ration of 2 (formulation 1):1 (formulation 2).

A mixture of certain components, in particular a mixture of one or more of the above monomers and acrylic elastomers, especially formulation 2, exhibits a phase change during the polymerization. It has been found that in the presence of certain elastomers, the curing changes the normally transparent material into a semi-transparent ("hazy looking") material.

This change in appearance is attributed to the emergence of a new phase, wherein a change in the refractive index comes with this change. In other words, the mixture exhibits a phase change. Said phase change can be exploited to enhance the security of the data carrier by hiding the floating security element, i.e. making the floating security element less visible, to the naked eye Namely, because of the hazy looking appearance the floating security element looks less obvious as compared to the more transparent processing layer.

It should be understood that additional components such as colors, security inks, color shifting pigments, etc. as they are known in the state of the art can be present in the processing layer as well.

The least one processing layer is particularly preferably curable upon the irradiation of electromagnetic radiation in the ultraviolet region of the electromagnetic spectrum. However, it is also conceivable that the processing layer is curable upon the irradiation of electromagnetic radiation being in the visible region of the electromagnetic spectrum or in the infrared region of the electromagnetic spectrum. In this case, corresponding curing resins are preferably selected as formulation for the processing layer.

The region of the processing layer being cured into the first curing state and the region of the processing layer being cured into the second curing state preferably differ in their refractive indices. The processing layer therefore preferably corresponds to a layer having a refractive index that changes upon the irradiation of electromagnetic radiation having particular properties such as particular intensities. In other words, a processing layer according to the invention enables impinging electromagnetic radiation, depending on the property of said impinging electromagnetic radiation, to create a difference in the refractive index of the cured processing layer.

Hence, by using a masking layer that comprises at least one masking element in order to generate electromagnetic radiation having different radiation properties depending on the presence and absence of the masking element the processing layer is selectively cured in dependence of said radiation properties. At the same time, the appearance of the masking element can be replicated in the processing layer. For example, if the masking element has the shape of a star then the security element generated in the processing layer appears a star because of electromagnetic radiation being transmitted through the star-shaped masking element.

The security element can be visible for an observer upon illumination of the data carrier with electromagnetic radiation, preferably upon illumination with electromagnetic radiation in the infrared region and/or the visible region and/or the ultraviolet region of the electromagnetic spectrum. That is to say, depending on the chemical composition of the processing layer and its curing states, it is possible to generate a security element that is not immediately obvious for an observer. To the contrary, additional illumination such as a flash light could be needed as illumination source. Such a security element can thus serve as a secondary feature against tampering.

One or more additional layers can be provided between the guiding layer and the processing layer, said one or more additional layers preferably correspond to a transparent and/or thermoplastic polymer such as biaxial oriented polypropylene. One or more additional layers can be desired if e.g. other security elements that are known in the state of the art shall be included in the data carrier. For example, one or more prints could be applied to said layers. However, said one or more additional layers can also serve the purpose of a substrate onto which a guiding layer to be cast and cured, see above, is coated and then cured on.

In another aspect a data carrier is provided, which data carrier comprises at least one guiding layer and at least one processing layer which is arranged after the at least one guiding layer with respect to an extension direction. The at least one guiding layer is configured to guide impinging electromagnetic radiation into the at least one processing layer. The at least one processing layer is curable upon an impingement of electromagnetic radiation having at least a first radiation property in said region of impingement into at least a first curing state and is curable upon an impingement of electromagnetic radiation having at least a second radiation property that is different from the first radiation property in said region of impingement into at least a second curing state being different from the first curing state. The second curing state of the processing layer constitutes at least one security element.

That is to say, the data carrier can comprise at least one security element which is constituted by at least one curing state of the processing layer which differs from another at least one curing state of the processing layer. These different curing states preferably correspond to regions of different refractive indices within the processing layer as has been outlined above. It should be noted that the data carrier preferably corresponds to a data carrier comprising the features as outlined above. Reference is therefore made to the above explanations.

In another aspect, a security document comprising a data carrier as described above is provided, wherein the security document preferably is an identity card, a passport, a credit card, a bank note or the like.

At this point it should be understood that the data carrier per se can correspond to a security document. This is the case if the data carrier is provided in the form of an identity card, for example. However, it is likewise conceivable to introduce or incorporate the data carrier into a security document. In the case of a passport for example the data carrier could be incorporated into a page of the passport. A security element such as a floating image of the passport owner, for example, could then be produced by means of the above method. However, other personalized data such as an image or a logo, or alphanumerical data, such as a name or a date of birth of the owner or machine-readable data, such as a barcode, or optical filters (e.g. a Moiré pattern) as they are known in the art could also be provided, if desired. An incorporation of the data carrier into a security document can be achieved by simply laminating the data carrier into a security document.

In another aspect, a data carrier as described above is used for producing a security document. For example, a security document can be produced by first laminating the "raw", i.e. unpersonalized data carrier into a security document such as a passport or the like and by then irradiating the processing layer with electromagnetic radiation in order to selectively generate regions of different curing states in the processing layer. However, it is also conceivable to produce a security document by first processing the processing layer with electromagnetic radiation so as to generate the different curing states in the processing layer and by then laminating the thus personalized data carrier into a security document such as a passport or the like.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

DESCRIPTION OF PREFERRED EMBODIMENTS

Figure 1:
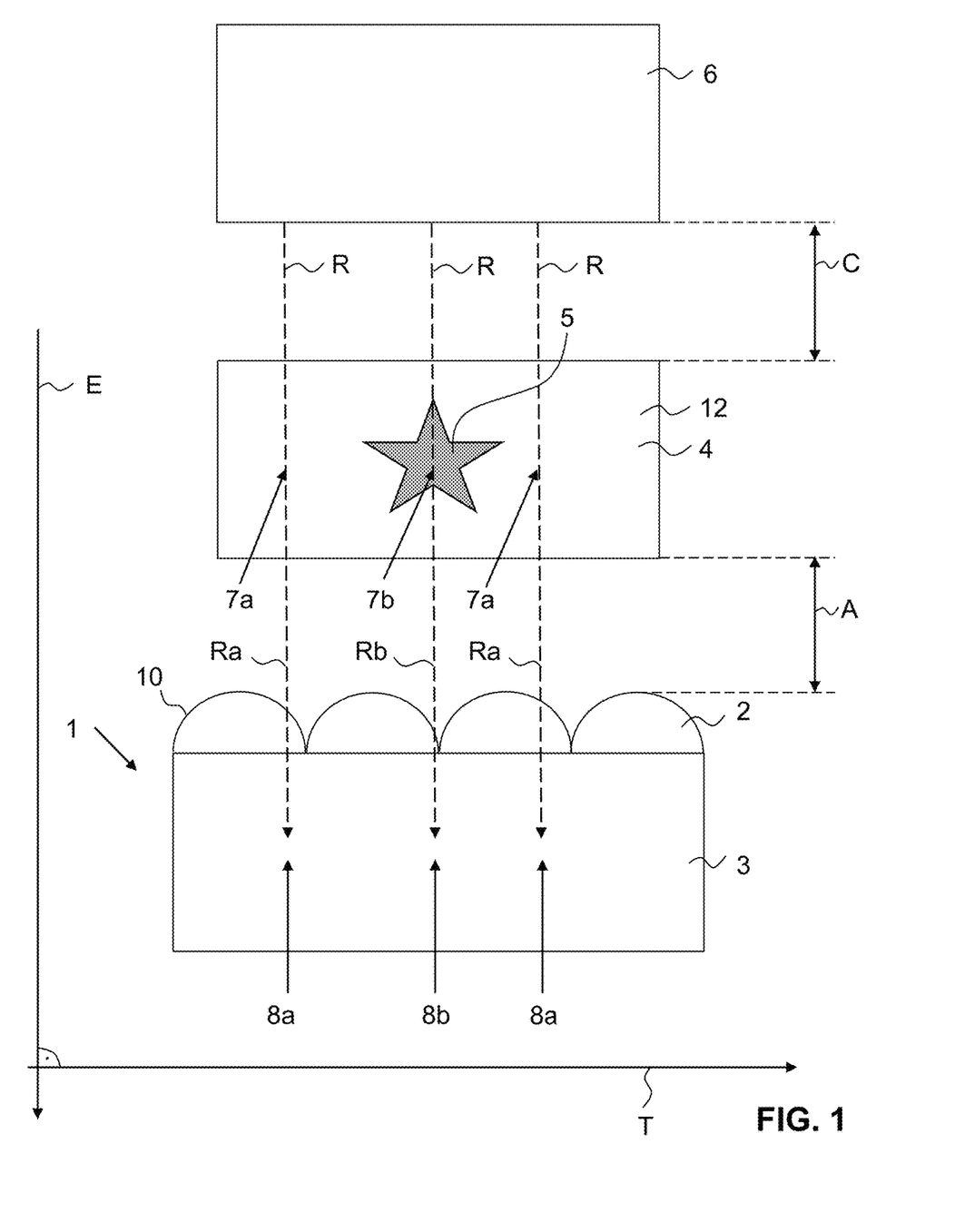
FIG. 1 shows a schematic representation of a method of producing a security element in a data carrier.

FIG. 1 schematically depicts a method of producing at least one security element 9 in a data carrier 1 using electromagnetic radiation being emitted from a source of radiation 6. In the present example the source of radiation 6 corresponds to a black lamp that is configured to emit electromagnetic radiation R being in the ultraviolet region of the electromagnetic spectrum. The data carrier 1 comprises at least one guiding layer 2 and at least one processing layer 3, wherein the at least one processing layer 3 is arranged after the at least one guiding layer 2 with respect to an extension direction E. The at least one guiding layer 2 is configured to guide impinging electromagnetic radiation R into the processing layer 3.

To this end, the guiding layer comprises at least one guiding structure 10, wherein the at least one guiding structure 10 is configured to focus impinging electromagnetic radiation R at a specific focal length with respect to the extension direction E. In the embodiment depicted in FIG. 1, the guiding structure 10 corresponds to a semi-spherical lens array which extends along an entire width of the data carrier and along a transverse direction T running perpendicularly to the extension direction E. Here, the lens array 10 is made from a transparent film that has a refractive index of about 1.5. The ultraviolet radiation being emitted from the source of radiation 6 passes through ambient air, which has a refractive index of 1, and bends towards the higher refractive index layer not shown for reasons of simplicity), which is here the processing layer 3. A particular lens of the lens array 10 guides and focuses impinging electromagnetic radiation R at a particular focal point within the processing layer 3. The at least one processing layer 3 is made of a curable material and is curable upon an interaction with impinging electromagnetic radiation R. To this end a curing state of the at least one processing layer 3 is determined by, inter alia, the intensity of the impinging electromagnetic radiation R.

For this reason a masking layer 4 comprising at least one masking element 5 is arranged before the at least one guiding layer 2 with respect to the extension direction E, and wherein the electromagnetic radiation R is irradiated from the source of radiation 6 through the masking layer 4 and onto the data carrier 1. The masking layer 4 comprises at least one transparent region 7a which is provided here by means of a transparent polymer constituting the masking layer 4. However, the masking layer 4 also comprises at least one region 7b that is not entirely transparent such that impinging electromagnetic radiation R does not pass through the masking layer 4 unchanged. Said non-entirely transparent region 7b is provided by means of a masking element 5 that is essentially opaque and which corresponds here to a dark gray print on a surface 12 of the masking layer 4. Hence, if electromagnetic radiation R impinges on the masking element 5, its opaque nature will absorb part of the electromagnetic radiation R. The electromagnetic radiation R that passes through the opaque region 7b of the masking layer 4, i.e. through the masking element 5, has therefore less intensity and thus a different radiation property Rb than a radiation property Ra of electromagnetic radiation R that passes through a transparent region 7a of the masking layer 4. In other words, the presence and absence of a masking element 5 on the masking layer 4 leads to electromagnetic radiation R leaving the masking layer towards the data carrier which has different radiation properties Ra, Rb. Consequently, electromagnetic radiation R that impinges on a region 7a of the masking layer 4 having no masking element 5 impinges on the at least one processing layer 3 as electromagnetic radiation having the first radiation property Ra, whereby the at least one processing layer 3 is cured in said region of impingement 8a into a first curing state, and electromagnetic radiation R that impinges on a region 7b of the masking layer 4 comprising the at least one masking element 5 impinges on the at least one processing layer 3 as electromagnetic radiation having the second radiation Rb, whereby the at least one processing layer 3 is cured in said region of impingement 8b into a second curing state, and whereby the shape of the masking element is reproduced in the processing layer. That is to say, the second curing state of the processing layer 3 constitutes the security element 9, see FIGS. 2 and 3. The data carrier 1 depicted in FIGS. 2 and 3 in each case comprises a processing layer 3 having a region 8a that is cured into the first curing state and that comprises a first refractive index and a region 8b that is cured into the second curing state and that comprises a second refractive index which differs from the first refractive index. This so-called photo induced refractive index change is caused by the presence of the masking element 5 in the masking layer 4.

As readily follows from FIG. 1, the masking layer 4 is arranged at a distance A from the at least one guiding layer 2 with respect to the extension direction E. Moreover, and although not depicted in the figures, the distance A between the masking layer and the guiding layer 2 can be varied with respect to the extension direction E, and a distance C between the source of radiation 6 and the masking layer 4 can be varied with respect to the extension direction E, respectively. By changing these distances, it is possible to adjust a depth and a width of the virtual security element movement within the processing layer 3.

Figure 2:
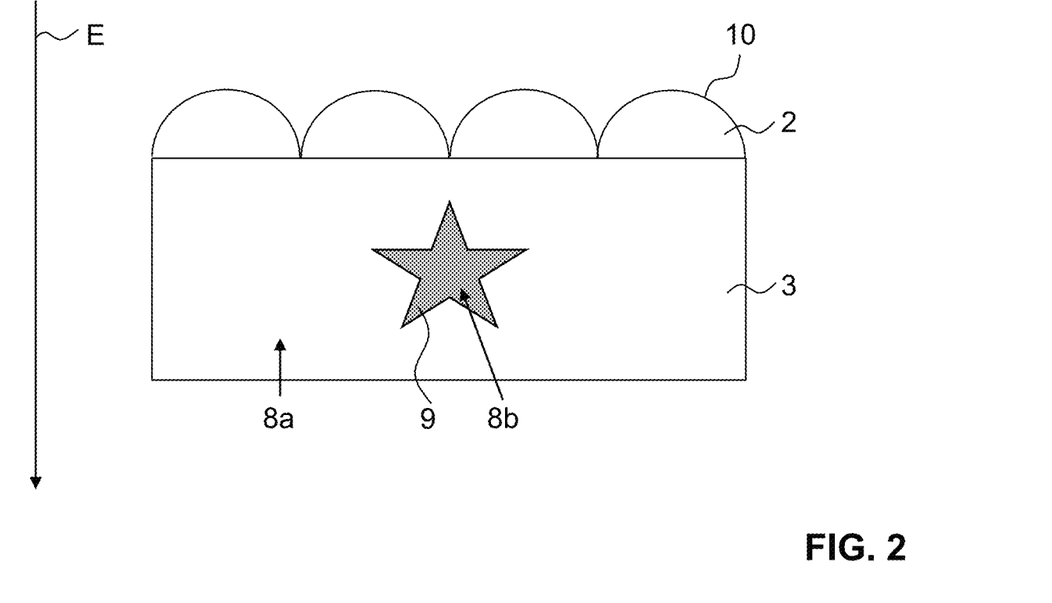
FIG. 2 shows a schematic representation of a data carrier comprising a security element that has been produced by the method according to FIG. 1.
Figure 3:
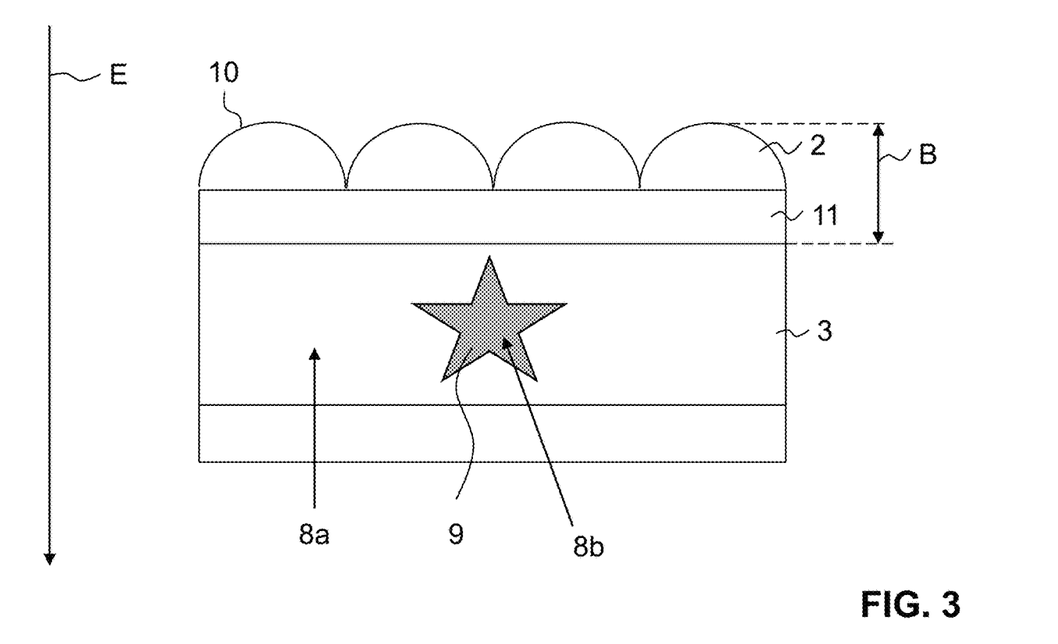
FIG. 3 shows a schematic representation of another data carrier comprising a security element that has been produced by the method according to FIG. 1.

In the embodiment depicted in FIGS. 1 and 2 the data carrier 1 comprises one guiding layer 2 and one processing layer 3 that are arranged immediately adjacent to one another with respect to the extension direction E, i.e. the guiding layer 2 is arranged on top of the processing layer 3. In the embodiment depicted in FIG. 3, however, the guiding layer 2 and the processing layer 3 are arranged at a distance B from one another with respect to the extension direction E. Between said layers 2, 3, one additional layer 11 is provided, which additional layer 11 serves as a substrate in the manufacturing of the guiding layer 2. In both embodiments, the layers constituting the data carrier 11 are permanently fixed within the data carrier 1. That is to say, the guiding layer 2, the processing layer 3, and if present also the additional layer 11, remain within the data carrier 1.

With respect to geometrical dimensions of the individual layers of the data carrier 1 it can be said that a conceivable thickness of the processing layer 3 lies in the range of about 0.5 centimeter to 3 centimeter and a conceivable thickness of the guiding layer 2 lies in the range of about 50 micrometer to 500 micrometer, respectively. If an additional layer 11 is present said layer should be flexible, thin, and sturdy enough to stand the processing rigor. A suitable thickness of the additional layer 11 is therefore less than about 300 micrometer, preferably less than about 250 micrometer.

LIST OF REFERENCE SIGNS

| | | | |
|---|---|---|---|
| 1 | data carrier | R | electromagnetic radiation |
| 2 | guiding layer | Ra | electromagnetic radiation having first radiation property |
| 3 | processing layer | | |
| 4 | masking layer | Rb | electromagnetic radiation having second radiation property |
| 5 | masking element | | |
| 6 | source of radiation | | |
| 7a, 7b | region on masking layer | E | extension direction |
| 8a, 8b | region in processing layer | T | transverse direction |
| 9 | security element | A | distance |
| 10 | guiding structure | B | distance |
| 11 | additional layer | C | distance |
| 12 | surface | | |

The invention claimed is:

1. A method of producing at least one security element (9) in a data carrier (1) comprising the steps of:
providing a source of radiation (6) that is configured to emit electromagnetic radiation (R);
providing a data carrier (1) that comprises at least one guiding layer (2) and at least one processing layer (3), wherein the at least one processing layer (3) is arranged after the at least one guiding layer (2) with respect to an extension direction (E), wherein the at least one guiding layer (2) comprises a spherical or semi-spherical lens array and is configured to guide impinging electromagnetic radiation (R) into the at least one processing layer (3), and wherein the at least one processing layer (3) is curable upon an interaction with electromagnetic radiation and wherein the at least one processing layer comprises a mixture of monomers and acrylic elastomers exhibiting a phase change during polymerization whereby curing changes the processing layer from a normally transparent material into a semi-transparent material;
providing at least one masking layer (4) comprising at least one masking element (5), the at least one masking layer (4) being arranged before the at least one guiding layer (2) with respect to the extension direction (E); and
irradiating electromagnetic radiation (R) from the source of radiation (6) through the masking layer (4) and onto the data carrier (1),
wherein electromagnetic radiation (R) that impinges on a first region (7a) of the masking layer (4) having no masking element (5) impinges on the at least one processing layer (3) as electromagnetic radiation having a first radiation property (Ra), whereby the at least one processing layer (3) is cured in said region of impingement (8a) into a first curing state, wherein electromagnetic radiation (R) that impinges on a second region (7b) of the masking layer (4) comprising the at least one masking element (5) impinges on the at least one processing layer (3) as electromagnetic radiation having a second radiation property (Rb) being different from the first radiation property (Ra), whereby the at least one processing layer (3) is cured in said region of impingement (8b) into a second curing state, and wherein the second curing state of the processing layer (3) constitutes the security element (9).

2. The method according to claim 1, wherein the masking layer (4) is arranged at a distance (A) from the at least one guiding layer (2) with respect to the extension direction (E).

3. The method according to claim 1, wherein the guiding layer (2) and the processing layer (3) are arranged immediately adjacent to one another with respect to the extension direction (E), or wherein the guiding layer (2) and the processing layer (3) are arranged at a distance (B) from one another with respect to the extension direction (E).

4. The method according to claim 1, wherein the guiding layer (2) and the processing layer (3) are permanently fixed within the data carrier (1).

5. The method according to claim 1, wherein a distance (C) between the source of radiation (6) and the masking layer (4) is varied with respect to the extension direction (E), and/or wherein a distance (A) between the masking layer and the guiding layer (2) is varied with respect to the extension direction (E).

6. The method according to claim 1, wherein the masking layer (4) comprises at least one transparent and/or thermoplastic polymer.

7. The method according to claim 6, wherein the at least one transparent and/or thermoplasticpolymer is selected from the group having the members polycarbonate, polyethylene, polybutylene.

8. The method according to claim 1, wherein the at least one masking element (5) is essentially opaque.

9. The method according to claim 8, wherein the at least one masking element (5) is selected from a metal compound, a print and/or an embossment in and/or on the masking layer (4).

10. The method according to claim 1, wherein the first radiation property (Ra) and the second radiation property (Rb) in each case correspond to an intensity of the electromagnetic radiation.

11. The method according to claim 1, wherein the guiding layer (2) comprises at least one polymer.

12. The method according to claim 11, wherein the guiding layer (2) comprises at least one polymer selected from the group having the members acrylic resin, acrylic polymer, polycarbonate, polyethylene terephthalate, polypropylene, and polyethylene, and wherein the at least one processing layer (3) comprises at least one of a polymer selected from the group acrylic elastomer, urethane, acrylate, methacrylate, a UV-curing resin, and a cationic curing resin.

13. The method according to claim 1, wherein the region (8a) of the processing layer (3) being cured into the first curing state and the region (8b) of the processing layer (3) being cured into the second curing state differ in their refractive indices.

14. The method according to claim 1, wherein the security element (9) is visible for an observer upon illumination of the data carrier (1) with electromagnetic radiation, wherein the illumination is illumination selected from the group having the members electromagnetic radiation in the infrared region, the visible region, and the ultraviolet region of the electromagnetic spectrum.

15. The method according to claim 1, wherein one or more additional layers (11) are provided between the guiding layer (2) and the processing layer (3), said one or more additional layers (11) is a transparent and/or thermoplastic polymer.

16. The method of claim 1, where the mixture of monomers and acrylic elastomers comprises:
ethoxylated nonylphenol acrylate between 30 to 50 percent by weight;
ethoxylated Bisphenol A diacrylate between 10 to 20 percent by weight;
a photo initiator between 0.5 to 5 percent by weight;
hydroxyethyl acrylate between 30 to 50 percent by weight; and
acrylic elastomer between 10 to 20 percent by weight.

17. A data carrier (1) comprising:
at least one guiding layer (2); and
at least one processing layer (3) which is arranged after the at least one guiding layer (2) with respect to an extension direction (E),
wherein the at least one guiding layer (2) comprises at least one guiding structure (10), wherein the at least one guiding structure (10) is a spherical or semi-spherical lens array and is configured to guide impinging electromagnetic radiation (R) into the at least one processing layer (3),
wherein the at least one processing layer (3) is curable upon an impingement of electromagnetic radiation having at least a first radiation property (Ra) in said region of impingement (8a) into at least a first curing state and is curable upon an impingement of electromagnetic radiation having at least a second radiation property (Rb) that is different from the first radiation property (Ra) in said region of impingement (8b) into at least a second curing state being different from the first curing state and wherein the at least one processing layer comprises a mixture of monomers and acrylic elastomers exhibiting a phase change during polymerization whereby curing changes the processing layer from a normally transparent material into a semi-transparent material, and
wherein the second curing state of the processing layer (3) constitutes at least one security element (9).

18. The data carrier of claim 17, further comprising at least one masking layer (4) comprising at least one masking element (5), the at least one masking layer (4) being arranged before the at least one guiding layer (2) with respect to the extension direction (E).

19. The data carrier of claim 18, wherein the masking layer (4) is arranged at a distance (A) from the at least one guiding layer (2) with respect to the extension direction (E).

20. The data carrier of claim 17, wherein the guiding layer (2) and the processing layer (3) are arranged at a distance (B) from one another with respect to the extension direction (E).

21. The data carrier of claim 17, wherein the guiding layer (2) and the processing layer (3) are permanently fixed within the data carrier (1).

22. The data carrier of claim 17, wherein the guiding layer (2) comprises at least one guiding structure (10), wherein the at least one guiding structure (10) is configured to focus impinging electromagnetic radiation (R) at a specific focal length with respect to the extension direction (E).

23. The data carrier of claim 22 wherein the guiding structure is a lens structure selected from the group spherical lens array and semi-spherical lens array.

24. The data carrier of claim 17, where the mixture of monomers and acrylic elastomers comprises:
- ethoxylated nonylphenol acrylate between 30 to 50 percent by weight;
- ethoxylated Bisphenol A diacrylate between 10 to 20 percent by weight;
- a photo initiator between 0.5 to 5 percent by weight;
- hydroxyethyl acrylate between 30 to 50 percent by weight; and
- acrylic elastomer between 10 to 20 percent by weight.

25. A security document comprising:
  a data carrier (1) having:
    at least one guiding layer (2); and
    at least one processing layer (3) which is arranged after the at least one guiding layer (2) with respect to an extension direction (E),
  wherein the at least one guiding layer (2) comprises at least one guiding structure (10), wherein the at least one guiding structure (10) is a spherical or semi-spherical lens array and is configured to guide impinging electromagnetic radiation (R) into the at least one processing layer (3),
  wherein the at least one processing layer (3) is curable upon an impingement of electromagnetic radiation having at least a first radiation property (Ra) in said region of impingement (8a) into at least a first curing state and is curable upon an impingement of electromagnetic radiation having at least a second radiation property (Rb) that is different from the first radiation property (Ra) in said region of impingement (8b) into at least a second curing state being different from the first curing state and wherein the at least one processing layer comprises a mixture of monomers and acrylic elastomers exhibiting a phase change during polymerization whereby curing changes the processing layer from a normally transparent material into a semi-transparent material,
  wherein the second curing state of the processing layer (3) constitutes at least one security element (9), and
  wherein the security document is an identity card, a passport, a credit card, or a bank note.

26. The security document of claim 25, where the mixture of monomers and acrylic elastomers comprises:
- ethoxylated nonylphenol acrylate between 30 to 50 percent by weight;
- ethoxylated Bisphenol A diacrylate between 10 to 20 percent by weight;
- a photo initiator between 0.5 to 5 percent by weight;
- hydroxyethyl acrylate between 30 to 50 percent by weight; and
- acrylic elastomer between 10 to 20 percent by weight.

* * * * *